United States Patent [19]

Oikawa et al.

[11] Patent Number: 5,758,316

[45] Date of Patent: May 26, 1998

[54] METHODS AND APPARATUS FOR INFORMATION ENCODING AND DECODING BASED UPON TONAL COMPONENTS OF PLURAL CHANNELS

[75] Inventors: Yoshiaki Oikawa; Kyoya Tsutsui, both of Kanagawa, Japan

[73] Assignee: Sony Corporation, Tokyo, Japan

[21] Appl. No.: 489,842

[22] Filed: Jun. 13, 1995

[30] Foreign Application Priority Data

Jun. 13, 1994 [JP] Japan ................................. 6-154134

[51] Int. Cl.$^6$ .................................................. G06F 15/332
[52] U.S. Cl. ...................................... 704/230; 704/230
[58] Field of Search ..................... 381/17–21; 395/2.12, 395/2.14, 2.38

[56] References Cited

U.S. PATENT DOCUMENTS

| | | |
|---|---|---|
| 3,349,183 | 10/1967 | Campanella . |
| 4,184,049 | 1/1980 | Crochiere et al. ............ 179/1 SA |
| 4,516,241 | 5/1985 | Farah et al. ................ 370/110.1 |
| 4,535,472 | 8/1985 | Tomcik ........................... 381/31 |
| 4,569,058 | 2/1986 | Grallert ........................... 375/27 |
| 4,573,187 | 2/1986 | Bui et al. ......................... 381/43 |
| 4,622,598 | 11/1986 | Doi et al. ........................ 360/22 |

(List continued on next page.)

FOREIGN PATENT DOCUMENTS

| | | | |
|---|---|---|---|
| 0 349 325 A2 | 1/1990 | European Pat. Off. ........ G11B 20/10 |
| 0370277 A2 | 5/1990 | European Pat. Off. ........ H04B 1/66 |
| 0370277 A3 | 5/1990 | European Pat. Off. ........ H04B 1/66 |
| 0423050 A1 | 4/1991 | European Pat. Off. ........ H04B 1/66 |
| 0 446 031 A3 | 9/1991 | European Pat. Off. ........ H04B 1/66 |
| 0 458 645 A2 | 11/1991 | European Pat. Off. ........ H04B 1/66 |

(List continued on next page.)

OTHER PUBLICATIONS

An application-specific FFT processor Electronic Engineering, Jun. 1988 pp. 100 and 104–106.

Application of Quadrature Mirror Filters To Split Band Voice Coding Schemes, Esteban et al., 1977 IEEE International Conference on Acoustics, Speech & Signal Processing, pp. 191–195.

Polyphase Quadrature Filters—A New Subband Coding Technique, Rothweiler ICASSP 1983, Boston, vol. 3, pp. 1280–1283.

(List continued on next page.)

*Primary Examiner*—David R. Hudspeth
*Assistant Examiner*—M. David Sofocleous
*Attorney, Agent, or Firm*—Limbach & Limbach L.L.P.

[57] ABSTRACT

A signal encoding method and apparatus by which a high encoding efficiency may be achieved by encoding tonal components of plural channels by exploiting channel-to-channel characteristics. The encoding of separately encoding first signals of plural channels is selectively changed over to the encoding of encoding the first signals of plural channels in common or vice versa depending on the results of detection of characteristics of the first signals of plural channels. The compression ratio may be improved if the first signals are encoded in common, while ill effects due to encoding in common may be avoided by separately encoding the first signals of plural channels.

14 Claims, 10 Drawing Sheets

U.S. PATENT DOCUMENTS

| | | | |
|---|---|---|---|
| 4,625,286 | 11/1986 | Papamichalis et al. | 364/513.5 |
| 4,697,212 | 9/1987 | Osawa et al. | 360/48 |
| 4,706,265 | 11/1987 | Furukawa | 375/122 |
| 4,748,579 | 5/1988 | Zibman et al. | 364/736 |
| 4,873,589 | 10/1989 | Inazawa et al. | 360/53 |
| 4,882,754 | 11/1989 | Weaver et al. | 381/35 |
| 4,885,790 | 12/1989 | McAulay | 381/36 |
| 4,903,301 | 2/1990 | Kondo et al. | 381/30 |
| 4,912,763 | 3/1990 | Galand et al. | 381/31 |
| 4,932,062 | 6/1990 | Hamilton | 381/43 |
| 4,949,383 | 8/1990 | Koh et al. | 381/31 |
| 5,016,107 | 5/1991 | Sasson et al. | 358/209 |
| 5,040,217 | 8/1991 | Brandenburg et al. | 381/47 |
| 5,120,387 | 6/1992 | Yoshikawa | 375/122 |
| 5,159,611 | 10/1992 | Tomita et al. | 375/34 |
| 5,185,800 | 2/1993 | Mahieux | 381/29 |
| 5,204,677 | 4/1993 | Akagiri et al. | 341/118 |
| 5,218,561 | 6/1993 | Iwadare | 364/725 |
| 5,222,189 | 6/1993 | Fielder | 395/2 |
| 5,241,603 | 8/1993 | Akagiri et al. | 381/37 |
| 5,243,588 | 9/1993 | Maeda et al. | 369/54 |
| 5,264,846 | 11/1993 | Oikawa | 341/76 |
| 5,268,685 | 12/1993 | Fujiwara | 341/76 |
| 5,285,476 | 2/1994 | Akagiri et al. | 375/25 |
| 5,285,498 | 2/1994 | Johnston | 381/2 |
| 5,294,925 | 3/1994 | Akagiri | 341/50 |
| 5,311,561 | 5/1994 | Akagiri | 375/122 |
| 5,381,143 | 1/1995 | Shimoyoshi et al. | 341/51 |
| 5,388,093 | 2/1995 | Yoshida et al. | 369/124 |
| 5,388,209 | 2/1995 | Akagiri | 395/2.38 |
| 5,406,428 | 4/1995 | Suzuki | 360/53 |
| 5,461,378 | 10/1995 | Shimoyoshi et al. | 341/51 |
| 5,471,558 | 11/1995 | Tsutsui | 395/2.28 |
| 5,539,829 | 7/1996 | Lokhoff et al. | 381/2 |
| 5,606,618 | 2/1997 | Lochoff et al. | 381/2 |

FOREIGN PATENT DOCUMENTS

| | | | |
|---|---|---|---|
| 0 463 472 A2 | 1/1992 | European Pat. Off. | G06F 15/332 |
| 0 466 190 A2 | 1/1992 | European Pat. Off. | G11B 20/10 |
| 0 473 367 A1 | 3/1992 | European Pat. Off. | H03M 7/30 |
| 0 506 394 A2 | 9/1992 | European Pat. Off. | G10L 7/00 |
| 0645769 A2 | 3/1995 | European Pat. Off. | G11B 20/00 |
| A 01 069 181 | 3/1989 | Japan | H04N 7/137 |
| 4-360331 | 12/1992 | Japan | H04B 14/00 |
| WO 90/09064 | 8/1990 | WIPO | H04B 1/66 |
| WO 91/16769 | 10/1991 | WIPO | H04B 1/66 |
| WO 92/12607 | 7/1992 | WIPO | H04S 3/00 |
| WO 92/17884 | 10/1992 | WIPO | G11B 20/10 |
| WO 94/28633 | 12/1994 | WIPO | H03M 7/30 |
| WO 95/01680 | 1/1995 | WIPO | H04B 14/04 |
| WO 95/12920 | 5/1995 | WIPO | H03M 7/30 |
| WO 95/27335 | 10/1995 | WIPO | H03M 7/30 |

OTHER PUBLICATIONS

The Critical Band Coder–Digital Encoding of Speech Signals Based on the Perceptual Requirements of the Auditory System, Krasner, 1080 IEEE, vol. 1–3, pp. 327–331.

An Application Specific DSP Chip for 100 MHZ Data Rates, Magar et al., IEEE 1988—pp. 1989–1992.

Perceptual Transform Coding of Wideband Stereo Signals, James D. Johnston, ICASSP '89, vol. 3, pp. 1993–1996.

Signal Compression: Technology Targets and Research Directions, Nikil Jayant, IEEE vol. 10, No. 5, pp. 796–818.

Subband/Transform Coding Using Filter Bank Designs Based on Time Domain Aliasing Cancellation, Princen et al., 1987 ICCC, pp. 2161–2164.

S. Chandra et al., "Linear Prediction with a Variable Analysis Frame Size," IEEE Transactions on Acoustics, Speech and Signal Processing, vol. ASSP–25, No. 4, Aug. 1977.

R. Crochiere et al., "Digital Coding of Speech in Sub––bands," The Bell System Technical Journal, vol. 55, No. 8, Oct. 1976.

R. Zelinski et al., "Adaptive Transform Coding of Speech Signals," IEEE Transactions on Acoustics, Speech and Signal Processing, vol. ASSP–25, No. 4, Aug. 1977, pp. 299–309.

METHODS AND APPARATUS FOR INFORMATION ENCODING AND DECODING BASED UPON TONAL COMPONENTS OF PLURAL CHANNELS

BACKGROUND OF THE INVENTION

This invention relates to an information encoding method and apparatus for encoding an input signal, such as digital data, by high-efficiency encoding, and an information signal decoding method and apparatus for decoding the encoded signal reproduced or transmitted via a recording medium having high efficiency encoded signals recorded thereon or over a transmission channel.

There are a variety of techniques for high efficiency encoding of signals, such as audio or speech signals. Examples of these techniques include transform coding in which a frame of digital signals representing the audio signal on the time axis is converted by an orthogonal transform into a block of spectral coefficients representing the audio signal on the frequency axis, and a sub-band coding in which the frequency band of the audio signal is divided by a filter bank into a plurality of sub-bands without forming the signal into frames along the time axis prior to coding. There is also known a combination of sub-band coding and transform coding, in which digital signals representing the audio signal are divided into a plurality of frequency ranges by sub-band coding, and transform coding is applied to each of the frequency ranges.

Among the filters for dividing a frequency spectrum into a plurality of equal-width frequency ranges include the quadrature mirror filter (QMF) as discussed in R. E. Crochiere, Digital Coding of Speech in Sub-bands, 55 Bell Syst.Tech J. No. 8 (1976). With such QMF filter, the frequency spectrum of the signal is divided into two equal-width bands. With the QMF, aliasing is not produced when the frequency bands resulting from the division are subsequently combined together.

In "Polyphase Quadrature Filters—A New Subband Coding Technique", Joseph H. Rothweiler ICASSP 83, Boston, there is shown a technique of dividing the frequency spectrum of the signal into equal-width frequency bands. With the present polyphase QMF, the frequency spectrum of the signals can be divided at a time into plural equal-width frequency bands.

There is also known a technique of orthogonal transform including dividing the digital input audio signal into frames of a predetermined time duration, and processing the resulting frames using a discrete Fourier transform (DFT), discrete cosine transform (DCT) and modified DCT (MDCT) for converting the signal from the time axis to the frequency axis. Discussions on MDCT may be found in J. P. Princen and A. B. Bradley, Subband Transform Coding Using Filter Bank Based on Time Domain Aliasing Cancellation", ICASSP 1987.

By quantizing the signals divided on the band basis by the filter or orthogonal transform, it becomes possible to control the band subjected to quantization noise and psychoacoustically more efficient coding may be performed by utilizing the so-called masking effects. If the signal components are normalized from band to band with the maximum value of the absolute values of the signal components, it becomes possible to effect more efficient coding.

In a technique of quantizing the spectral coefficients resulting from an orthogonal transform, it is known to use sub bands that take advantage of the psychoacoustic characteristics of the human auditory system. That is, spectral coefficients representing an audio signal on the frequency axis may be divided into a plurality of critical frequency bands. The width of the critical bands increase with increasing frequency. Normally, about 25 critical bands are used to cover the audio frequency spectrum of 0 to 20 kHz. In such a quantizing system, bits are adaptively allocated among the various critical bands. For example, when applying adaptive bit allocation to the spectral coefficient data resulting from MDCT, the spectral coefficient data generated by the MDCT within each of the critical bands is quantized using an adaptively allocated number of bits.

There are presently known the following two bit allocation techniques. For example, in IEEE Transactions of Acoustics, Speech and Signal Processing, vol. ASSP-25, No. 4, August 1977, bit allocation is carried out on the basis of the amplitude of the signal in each critical band. This technique produces a flat quantization noise spectrum and minimizes the noise energy, but the noise level perceived by the listener is not optimum because the technique does not effectively exploit the psychoacoustic masking effect.

In the bit allocation technique described in M. A. Krassner, The Critical Band Encoder—Digital Encoding of the Perceptual Requirements of the Auditory System, ICASSP 1980, the psychoacoustic masking mechanism is used to determine a fixed bit allocation that produces the necessary signal-to-noise ratio for each critical band. However, if the signal-to-noise ratio of such a system is measured using a strongly tonal signal, for example, a 1 kHz sine wave, non-optimum results are obtained because of the fixed allocation of bits among the critical bands.

For overcoming these inconveniences, a high efficiency encoding apparatus has been proposed in which the total number of bits available for bit allocation is divided between a fixed bit allocation pattern pre-set for each small block and a block-based signal magnitude dependent bit allocation, and the division ratio is set in dependence upon a signal which is relevant to the input signal such that the smoother the signal spectrum, the higher becomes the division ratio for the fixed bit allocation pattern.

With this technique, if the energy is concentrated in a particular spectral component, as in the case of a sine wave input, a larger number of bits are allocated to the block containing the spectral component, for significantly improving the signal-to-noise characteristics in their entirety. Since the human auditory system is highly sensitive to a signal having acute spectral components, such technique may be employed for improving the signal-to-noise ratio for improving not only measured values but also the quality of the sound as perceived by the ear.

In addition to the above techniques, a variety of other techniques have been proposed, and the model simulating the human auditory system has been refined, such that, if the encoding device is improved in its ability, encoding may be made with higher efficiency in consideration of the human auditory system.

In general, the noise contained in tonal acoustic signals in which the energy of spectral components is concentrated in a particular frequency proves a serious obstruction to the hearing sense in that it is more readily heard by the ears than the noise added to acoustic signals whose energy is smoothly distributed over a broad frequency range. In addition, if spectral components having a large energy, that is tonal components, are not quantized with sufficient quantization steps, frame-to-frame distortion becomes significant when these spectral components are restored into waveform signals on the time axis so as to be combined with forward and backward frames. That is, significant connection distortion occurs when the waveform signal on the time axis is combined with the waveform signal of adjacent frames. The result is again a serious obstruction to ears. Thus it has been difficult with the conventional method to improve the encoding efficiency for the tonal components without deteriorating the sound quality.

The present Assignee already proposed in PCT/JP94/00880 (International Publication No. WO94/28633, date of international publication, Dec. 8, 1994 a technique of separating the input acoustic signal into tonal components having the energy concentrated in a specific frequency and components having the energy smoothly distributed in a broader frequency range, that is noisy or non-tonal components, and encoding the respective components for achieving a high encoding efficiency.

With the previously proposed method, the input audio signal is transformed into frequency-domain components which are then grouped in, for example, critical bands. The spectral components are then divided into tonal components and noisy or non-tonal components. The tonal components, that is spectral components within an extremely narrow range on the frequency spectrum where the tonal components exist are encoded with high efficiency by normalization and quantization. The above-mentioned extremely narrow range on the frequency axis where the tonal components encoded with high efficiency encoding exist may be exemplified by a range consisting of a pre-set number of spectral components which themselves are tonal components and are centered about a spectral component having a locally maximum energy.

It is possible with the above-described encoder to realize encoding with high efficiency as compared to a method of quantizing frequency components contained in each of the fixed frequency bands.

Meanwhile, acoustic signals are processed in many cases as multi-channel signals.

There is shown in FIG.12 a configuration for encoding the multi-channel signals.

Referring to FIG.12, audio signals of plural channels $ch_1$, $ch_2$, ... $ch_n$ are routed via associated input terminals $30_1$ to $30_n$ to associated sampling and quantization units $31_1$ to $31_n$ where the audio signals of the respective channels are converted into quantized signals. The quantized signals from the sampling and quantization units $31_1$ to $31_n$ are routed to encoding units $32_1$ to $32_n$, respectively.

The encoded signals from the encoding units $32_1$ to $32_n$ are routed to a formatter 33 which then assembles the encoded multi-channel signals into a bitstream for transmission or recording on a recording medium in accordance with a pre-set format. This bitstream is outputted at an output terminal 34 so as to be transmitted or recorded on a recording medium.

FIG.13 shows a configuration of a decoder for decoding the encoded multi-channel signals.

Referring to FIG.13, the encoded signals, transmitted or reproduced from a recording medium, are routed via an input terminal 40 to a deformatter 41. The deformatter 41 resolves the bitstream supplied thereto into channel-based encoded signals in accordance with a pre-set format. The channel-based encoded signals are routed to decoding units $42_1$ to $42_n$ associated with the respective channels.

Decoded signals from the decoding units $42_1$ to $42_n$ are converted by digital-to-analog (D/A) converters $43_1$ to $43_n$. These analog signals are outputted at associated output terminals $44_1$ to $44_n$ as decoded signals of the channels $ch_1$ to $ch_n$, respectively.

As for multi-channel encoding, there are currently known a variety of methods other than that described above. For example, there is discussed in JP Patent Kokai Publication JP-A-4-360331 a method for achieving high efficiency signal compression by taking advantage of the characteristics of the auditory system of the human being that it is not the phase difference but the waveform of the monaural signal that plays an important role as long as high subband signals in right subband signal components and left subband signal components of stereo signals (2-channel signals) are concerned. In addition, there is disclosed in International Publication WO92/12607 a technique of encoding subbands of a signal representing a sound field in connection with the recording, transmission and the reproduction of the multi-dimensional sound field intended to be heard by the human being, as an encoding technique which takes advantage of the characteristics among plural channels. The decoded signals are transmitted by multiplexed separate signals and synthesized signals along with a control signal which transmits a relative level of the encoded signal or the definite azimuth of the sound field represented by the encoded signal. These techniques effect signal compression using the characteristics among the different channels.

If the above-mentioned technique of transforming the signal into frequency components, separating these frequency components into tonal components and noisy components and encoding these tonal and noise components can be applied to encoding of multi-channel signals which effects compression using the characteristics among the different channels, it becomes possible to further reduce the volume of the information when recording or transmitting the multi-channel signals on a recording medium or transmitting medium of a limited storage or transmission capacity. However, there lacks up to now a concrete proposal as to such technique.

SUMMARY OF THE INVENTION

In view of the foregoing, it is an object of the present invention to provide a signal encoding method and apparatus and a signal decoding method and apparatus whereby the volume of encoding data may be prohibited from being increased even when handling plural channels and the resulting signal may be prevented from being deteriorated in quality even although the data encoding volume is prohibited from being increased.

In one aspect, the present invention provides a signal encoding method in which plural-channel input signals are converted into frequency components, which frequency components are separated into first signals made up of tonal components and second signals made up of other components, and subsequently encoded. The encoding method includes the steps of encoding the first signals of plural channels by handling the first signals in common. The present invention also provides an apparatus for carrying out the signal encoding method.

In another aspect, the present invention provides a signal decoding method for decoding an encoded signal which is produced by separating frequency components of plural channels into first signals of tonal components and second signals of other components and by decoding the first and second signals. The method resides in decoding the encoded first signals of plural channels based upon the results of detection of the characteristics of the first signals of plural channels and decoding the channel-based encoded second signals from one channel to another. The present invention also provides an apparatus for carrying out the signal decoding method.

With the signal encoding method and apparatus of the present invention, since the encoding of separately encoding the first signals of plural channels is selectively changed over to the encoding of encoding the first signals of plural channels in common or vice versa depending on the results of detection of characteristics of the first signals of plural channels. Thus the compression ratio may be improved if the first signals are encoded in common, while ill effects due to encoding in common may be avoided by separately encoding the first signals of plural channels.

With the signal decoding method and apparatus of the present invention, since the encoded second signals of the respective channels are decoded and decoding of separately encoded first signals of plural channels is selectively changed over to the decoding of the first signals of plural channels encoded in common or vice versa depending on the results of detection of characteristics of the signals of plural channels. Thus the decoded signal may be regenerated from encoded signals obtained by the encoding method and apparatus.

According to the present invention, the volume of encoded data may be prohibited from being increased even if signals of plural channels are handled. In addition, the decoded signals may be prohibited from being lowered in quality even although the encoded data volume is prohibited from being increased.

DESCRIPTION OF THE PREFERRED EMBODIMENTS

Figure 1:
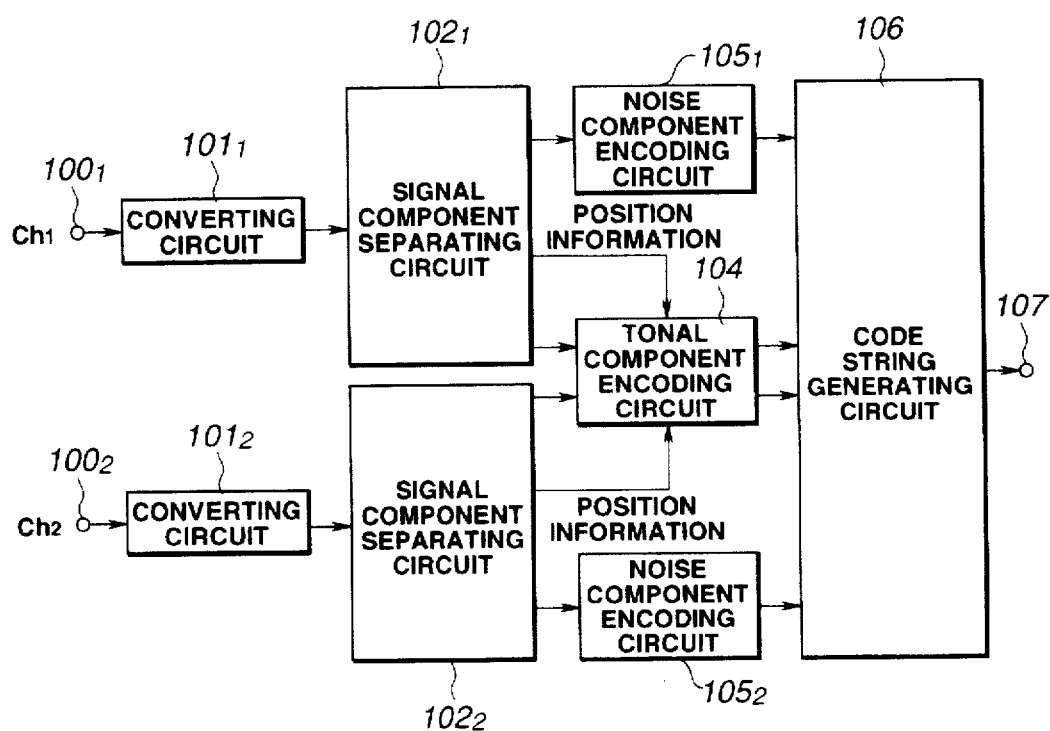
FIG.1 is a schematic block circuit diagram showing a configuration of a signal encoding apparatus according to an embodiment of the present invention.

Referring to the drawings, preferred illustrative embodiments of the present invention will be explained in detail.

FIG.1 shows a basic configuration of a signal encoder (encoding apparatus) for carrying out a signal encoding method according to the present invention. In the embodiment of FIG.1, left and right channels of audio signals are taken as examples for the plural channels.

Referring to FIG.1, audio signals of a channel $ch_1$, such as a right channel, and audio signals of a channel $ch_2$, such as a left channel, are supplied to terminals $100_1$ and $100_2$, respectively. The audio signals of the channel $ch_1$ and the channel $ch_2$ are routed to converting circuits $101_1$, $101_2$, respectively. These converting circuits $101_1$, $101_2$ are each made up of a band-splitting filter and a forward orthogonal transform circuit, such as MDCT circuit.

The frequency components from the converting circuits $101_1$, $101_2$ are routed to signal component separating circuits $102_1$, $102_2$, respectively. These signal component separating circuits $102_1$, $102_2$ separate the frequency components into tonal components and noise components, as will be explained subsequently. The signal component separating circuits $102_1$, $102_2$ route the position information of the separated tonal components on the frequency axis to a tonal component encoding circuit 104. The specified technique of separating the frequency components into tonal and noise components is discussed in the above-referenced PCT/JP94/00880.

The tonal components separated by the signal component separating circuits $102_1$ and the tonal component separated by the signal component separating circuit $102_2$ are both routed to the tonal component encoding circuit 104. The noise component separated by the signal component separating circuits $102_1$ and the noise component separated by the signal component separating circuit $102_2$ are routed to and encoded by a noise component encoding circuit $105_1$ and a noise component encoding circuit $105_2$, respectively. The tonal component encoding circuit 104 encodes the tonal components of the channels $ch_1$ and $ch_2$ after common handling processing or without common handling processing, that is separately, depending on signals characteristics, as will be explained subsequently. The signal components encoded by these tonal component encoding circuit 104 and the noise component encoding circuits $105_1$, $105_2$ are fed to a code string generating circuit 106.

The code string generating circuit 106 converts the encoded signal components supplied thereto into a pre-set code string which is outputted at an output terminal 107. An error correction code is appended to an output signal of the output terminal 107 at an ECC encoder, not shown. The resulting signal is modulated by an eight-to-fourteen modulation (EFN) circuit before being recorded by a recording head on e.g., a disc-shaped recording medium or a motion picture film. A magneto-optical disc, a phase-transition disc, an IC card or the like may be employed as a recording medium. The code string may be transmitted over a transmission path such as satellite broadcasting or CATV.

Figure 2:
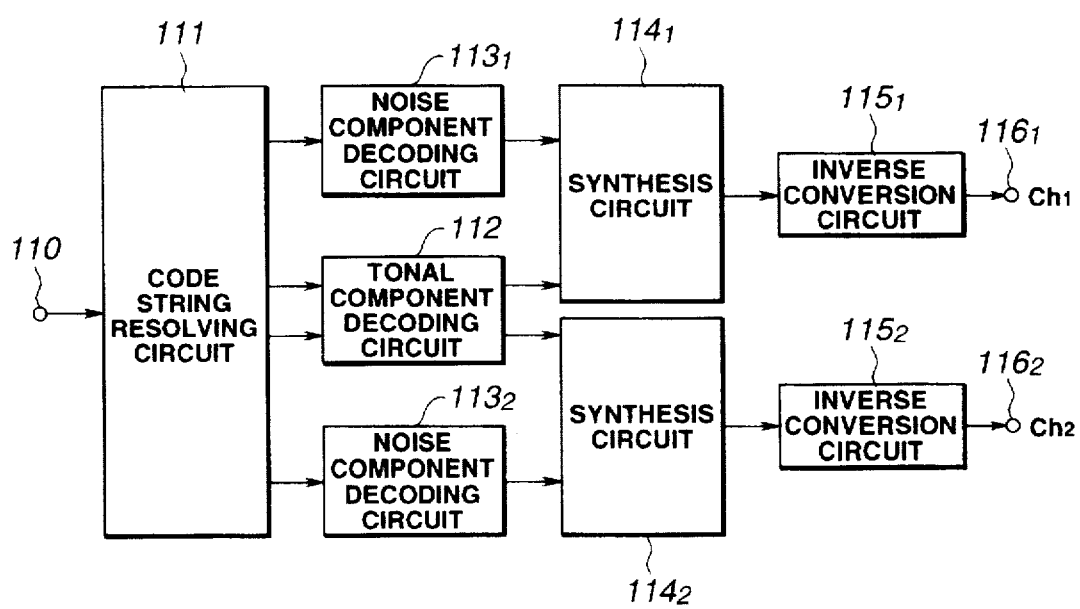
FIG.2 is a schematic block circuit diagram showing a configuration of a signal decoding apparatus according to an embodiment of the present invention.

FIG.2 shows a configuration of a decoder (decoding apparatus) which is a counterpart of the encoder shown in FIG.1.

Referring to FIG.2, a code string reproduced by a reproducing head from the recording medium, such as a disc-shaped recording medium, a motion picture film or the like, not shown, and processed with EFM demodulation and error correction, is supplied to an input terminal 110.

The code string fed to the input terminal 110 is fed to a code string resolving circuit 111. From the error-corrected code string, which portion of each channel corresponds to the tonal component code is recognized, based upon the number of tonal component information data of channels $ch_1$ and $ch_2$. Thus the tonal components of the channels $ch_1$ and $ch_2$ are separated from the noise components. The position information of the tonal component code of the respective channels are routed to downstream synthesis circuits $114_1$, $114_2$, not shown.

The tonal components for the channel $ch_1$ and the tonal components for the channel $ch_2$, from the code string resolving circuit 111, both routed to a tonal component decoding circuit 112. If these codes are previously handled in common during encoding, the common handling processing is canceled, at the same time that these codes are decoded by dequantization and denormalization. If these codes are not previously handled in common during encoding, the dequantization and normalization are canceled and the codes are decoded. On the other hand, the noise component codes for the channel $ch_1$ and the noise component codes for the channel $ch_2$, from the code string resolving circuit 111, are routed to noise component decoding circuits $113_1$, $113_2$, respectively, where they are decoded by dequantization and denormalization.

Subsequently, the tonal components for the channel $ch_1$, decoded by the tonal component decoding circuit 112, and the tonal components for the channel $ch_1$, decoded by the tonal component decoding circuit $113_1$, are routed to a synthesis circuit $114_1$. The tonal components for the channel $ch_2$, a decoded by the tonal component decoding circuit 112, and the tonal components for the channel $ch_2$, decoded by the tonal component decoding circuit $113_2$, are routed to a synthesis circuit $114_2$.

The synthesis circuits $114_1$, $114_2$ add the decoded tonal components of the respective channels to pre-set positions of the decoded noise components of the respective channels, based upon the position information of the tonal components of the respective channels supplied from the code string resolving circuit 111 for synthesizing the noise components and the tonal components of the respective channels on the frequency axis.

The decoded signals for the channel $ch_1$ from the synthesis circuit $114_1$ and the decoded signals for the channel $ch_2$ from the synthesis circuit $114_2$ are supplied to inverse conversion circuits $115_1$, $115_2$, respectively. The frequency-domain signals restored by the back conversion circuits $115_1$, $115_2$ into the original time-domain signals are outputted at terminals $116_1$, $116_2$ for the respective channels, respectively.

Figure 3:
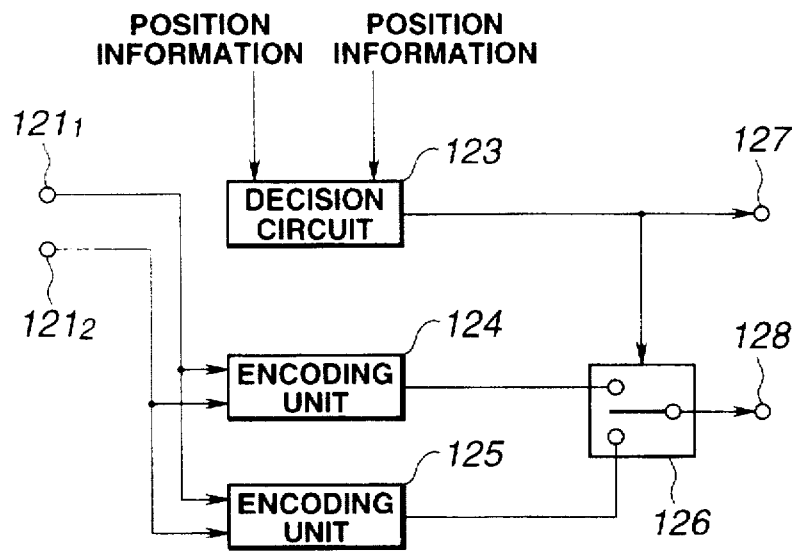
FIG.3 is a block circuit diagram showing an illustrative configuration of a tonal component encoding circuit of the signal encoder of the embodiment.

Referring to FIG.3, an illustrative configuration of the tonal component encoding circuit 104 shown in FIG.1 is explained.

The signal encoder of the present embodiment includes, as main components, a decision circuit 123 as detection means for detecting characteristics of tonal components of plural channels, a first encoding unit 124 as encoding means for separately encoding the tonal components of the plural channels, a second encoding unit 125 as means for common handling and encoding of tonal components of plural channels, and a changeover switch 126 for selectively switching between an output of the first encoding unit 124 and an output of the second encoding unit 125 based upon a decision output of the decision circuit 123.

Referring to FIG.3, the tonal components for the channel $ch_1$ from the signal component separating circuit $102_1$ and the tonal components for the channel $ch_2$ from the signal component separating circuit $102_2$, shown in FIG.1, are routed to terminals $121_1$, $121_2$, respectively.

The tonal components of the respective channels are routed to a first encoding unit 124 and a second encoding unit 125. The first encoder 124 encodes the tonal components of the channels $ch_1$ and $ch_2$ without common handling, while the second encoder 125 encodes the tonal components of the channels $ch_1$ and $ch_2$ after common handling. The tonal components of the respective channels, encoded by the first encoding unit 124 and the tonal components encoded in common by the second encoding unit 125, are routed to one and the other fixed input terminals of the changeover switch 126.

The decision circuit 123 controls the switching of the changeover switch 126 depending upon correlation of the tonal components of the respective channels.

The decision circuit 123 is fed with the position information specifying the position on the frequency axis of the tonal components separated by the signal component separating circuits $102_1$, $102_2$. The decision circuit 123 compares the two position information data and, if the difference therebetween is zero or not more than a pre-set threshold value, switches the changeover switch 126 to the side of the second encoding unit 125. If otherwise, the decision circuit switches the changeover switch 126 to the first encoder 124.

In the present embodiment, if tonal components in the vicinity of the same frequency are found among the tonal components detected on the channel basis, the tonal components of the plural channels in the vicinity of the same frequency are encoded using the above-mentioned channel-to-channel characteristics for realizing a higher encoding efficiency.

The changeover switch 126 has one or the other of its fixed input terminals selected depending upon a signal specifying the results of decision of the decision circuit 123. Thus the changeover switch 126 selects the encoded output of the first encoding unit 124 or the encoded output of the second encoding unit 125 depending on the results of decision by the decision circuit 125.

An output of the changeover switch 126 is issued at a terminal 128 as a separately encoded tonal component signal or a tonal component signal encoded in common so as to be transmitted to the code string generating circuit 106. The signal specifying the result of decision by the decision circuit 123 from a terminal 127 and the tonal component position information are also fed to the code string generating circuit 106.

Figure 4:
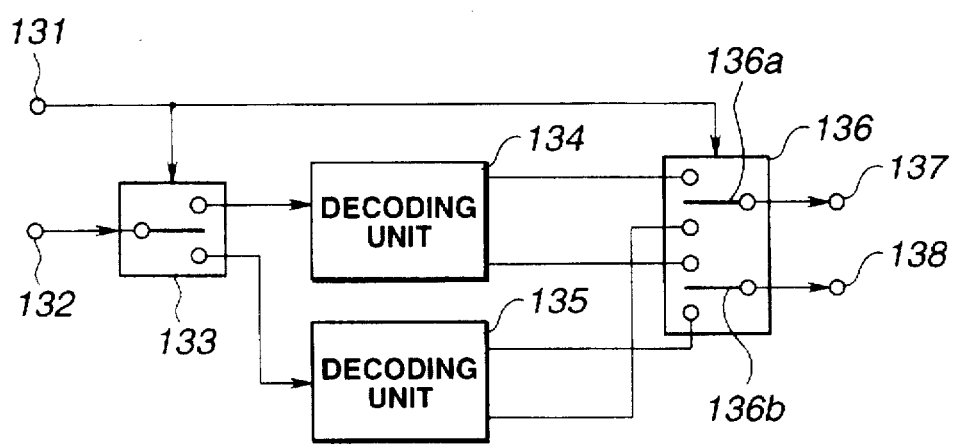
FIG.4 is a block circuit diagram showing an illustrative configuration of a tonal component decoding circuit of the signal encoder of the embodiment.

FIG.4 shows an illustrative configuration of the tonal component decoding circuit 112 of the decoder of FIG.2 as a counterpart circuit of the tonal component encoding circuit shown in FIG.3.

That is, the signal decoder of the present embodiment has, in addition to the noise component decoding circuit 113 of FIG.2 for decoding the encoded channel-based noise components, as a main constituent element, a configuration shown in FIG.4, and includes a first decoding unit 134 as separate decoding means for decoding the separately encoded tonal components, that is tonal components encoded without being in common, and a second decoding unit 135 as common decoding means for decoding the tonal components encoded in common. The decoder also includes changeover switches 133 and 136 as selection means for selecting the first decoding unit 134 or the second decoding unit 135 based upon the results of detection of characteristics at the time of the encoding, that is a signal specifying the result of decision by the decision circuit 123 of FIG.3.

Referring to FIG.4, the encoded tonal components, separated from the code string by the code string resolving circuit 111 of FIG.2, are fed via a terminal 132 to the changeover switch 133. A signal specifying the results of decision of the decision circuit 123 of FIG.3, separated by the code string resolving circuit 111 from the code string, is supplied to a terminal 131 and thence to a changeover control terminal of the changeover switch 133.

The changeover switch 133, which is switched depending upon the signal specifying the results of decision, transmits the encoded tonal components from the terminal 132 via one of the fixed input terminals thereof to the first decoding unit 134 or via the other of the fixed input terminals thereof to the second decoding unit 135 if the encoded tonal components are the tonal components encoded without being in common or the tonal components encoded in common. The first decoding unit 134 is a counterpart of the first encoding unit 124 of FIG.3 and decodes the encoded tonal components of the channels $ch_1$, $ch_2$ which are encoded without being in common. The second decoding unit 135 is a counterpart of the second encoding unit 124 of FIG.3 and separates the tonal components encoded in common into respective channels and decodes the resulting separated tonal components or decodes the tonal components encoded in common and subsequently separates the decoded tonal components into respective channels.

From these first and second decoding units 134, 135, the decoded tonal components of the channel $ch_1$ are routed to one fixed input terminals associated with a movable contact 136a of the changeover switch 136, while the decoded tonal components of the channel $ch_2$ are routed to the other fixed input terminals associated with a movable contact 136b of the changeover switch 136. The changeover switch 136 is selectively switched to the movable contact 136a or to the movable contact 136b in an interlocked relation responsive to the signal specifying the results of decision supplied via the terminal 131. An output of the movable contact 136a is outputted as tonal components of the channel $ch_1$ at an associated terminal 137, while an output of the movable contact 136b is outputted as tonal components of the channel $ch_2$ at an associated terminal 138. Outputs of the output terminals 137, 138 are routed to associated synthesis circuits $114_1$, $114_2$ of FIG.2, respectively.

Figure 5:
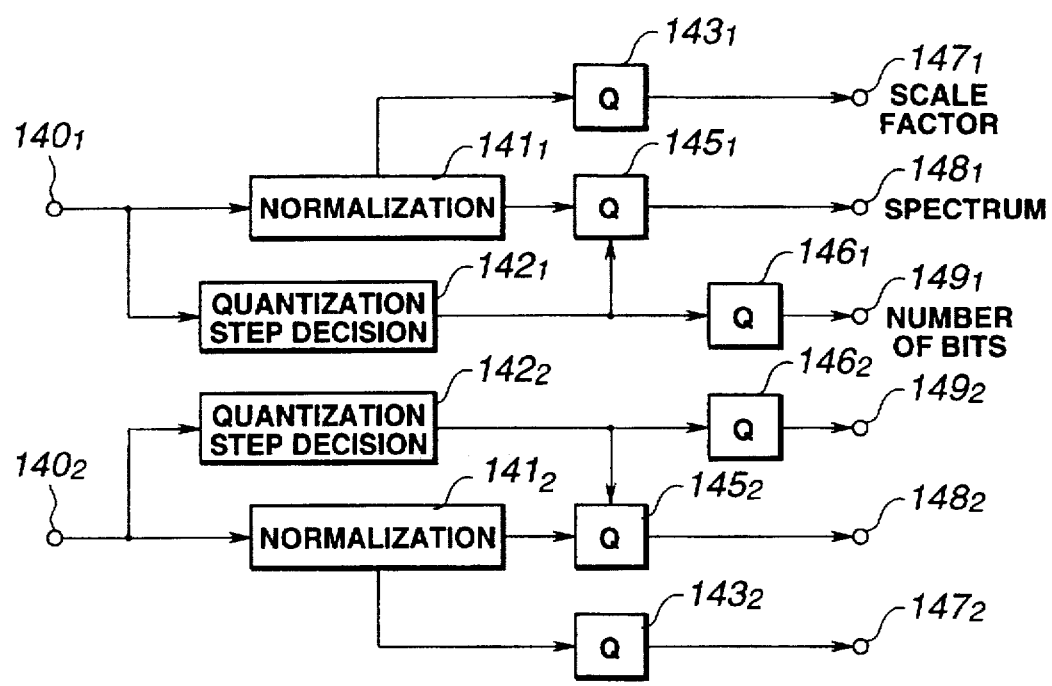
FIG.5 is a block circuit diagram showing an illustrative configuration of a first encoding circuit in the tonal component encoding circuit of the encoding apparatus of the embodiment.

FIG.5 shows an illustrative configuration of the first encoding unit 124 of FIG.3 for encoding the tonal components of the respective channels without being in common.

Referring to FIG.5, the tonal components for the channel $ch_1$ are routed via the terminal $121_1$ of FIG.3 to a terminal $140_1$, while the tonal components for the channel $ch_2$ are routed via the terminal $121_2$ of FIG.3 to a terminal $140_2$. These tonal components are routed to associated normalization circuits $141_1$, $141_2$.

The normalization circuits $141_1$, $141_2$ normalize the tonal components for the channels $ch_1$, $ch_2$, respectively, and transmit the normalized frequency components to quantization units $145_1$, $145_2$, while transmitting the normalized scale factors to quantization units $143_1$, $143_2$.

The scale factors quantized by the quantization units $143_1$, $143_2$ are outputted at associated terminals $147_1$, $147_1$ respectively. The quantization units $145_1$, $145_2$ quantize the frequency components of the respective channels with the numbers of quantization bits based upon the adaptive quantization step information from associated quantization step decision circuit "$142_1$, $142_2$. The quantized frequency components from the quantization units $145_1$, $145_2$ are outputted at associated terminals $148_1$, $148_2$, respectively.

The quantization step information from the quantization step decision circuit "$142_1$, $142_2$, is also quantized by quantization units $146_1$, $146_2$, so as to be outputted at associated terminals $149_1$, $149_2$, respectively.

The encoded frequency components, frequency components and the scale factors from the terminals 147 to 149 are routed to one of the fixed input terminals of the changeover switch 126 shown in FIG.3.

Figure 6:
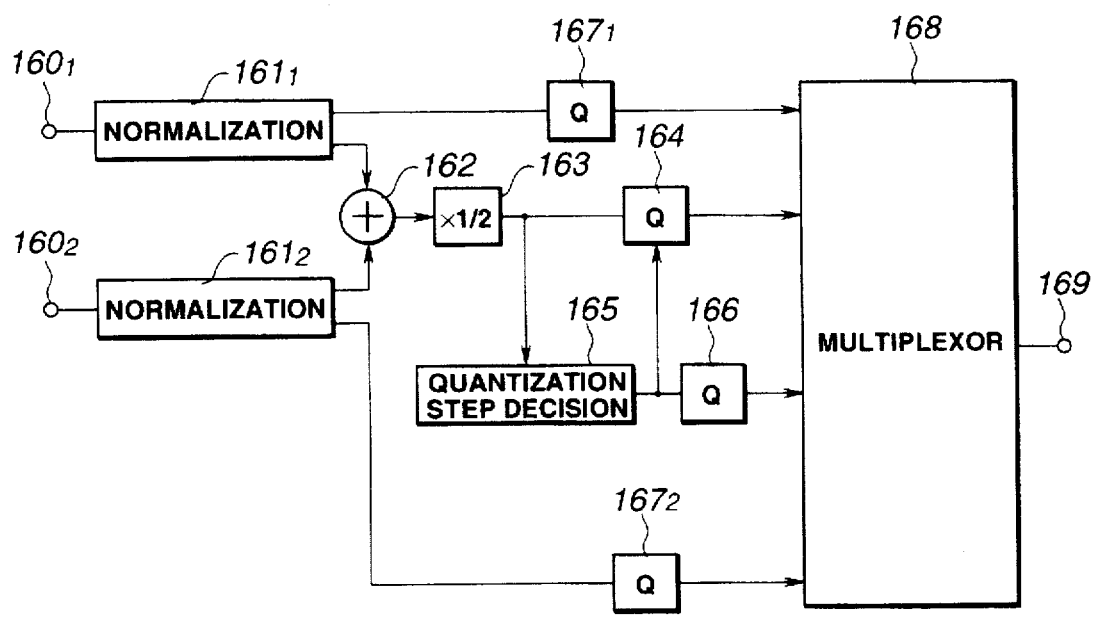
FIG.6 is a block circuit diagram showing an illustrative configuration of a second encoding circuit in the tonal component encoding circuit of the encoding apparatus of the embodiment.

FIG.6 shows an illustrative configuration of the second encoding circuit 125 of FIG.3 for encoding the tonal components in common.

Referring to FIG.6, the tonal components for the channel $ch_1$ via the terminal $121_1$ and the tonal components for the channel $ch_2$ via the terminal $121_2$ (FIG.3) are supplied to terminals $160_1$, $160_2$, respectively, and thence supplied to associated normalization circuits $161_1$, $161_2$, respectively.

The normalization circuits $161_1$, $161_2$ normalize the tonal components for the channels $ch_1$, $ch_2$, respectively, in a manner as described previously. The resulting scale factors are routed to quantization units $167_1$, $167_2$. The scale factors quantized by these quantization units $^{167}1$, $167_2$ are fed to a multiplexor 168. The frequency components, normalized by the normalization circuits $161_1$, $161_2$, are routed to an adder 162.

The adder 162 adds the normalized frequency components of the respective channels. An output of the adder 162 is fed to a quantizer 164 via a multiplier 163 for multiplying a coefficient equal to ½. The quantizer 164 quantizes the signal component supplied thereto with the number of allocated bits which is based upon the quantization step information from a quantization step decision circuit 165 which determines the quantization step based upon an output of the multiplier 163. An output of the quantizer 164 is supplied to a multiplexor 168, while the quantization step information from the quantization step decision circuit 165 is quantized by a quantizer 166 and thence transmitted to the multiplexor 168.

The multiplexor 168 multiplexes the frequency components handled in common and quantized by the quantizer 164 as explained above, quantized quantization step information and the quantized channel-based scale factors and outputs the multiplexed data at an output terminal 169. An output of the terminal 169 is routed to the fixed input terminal of the changeover switch 126 shown in FIG.3.

Figure 7:
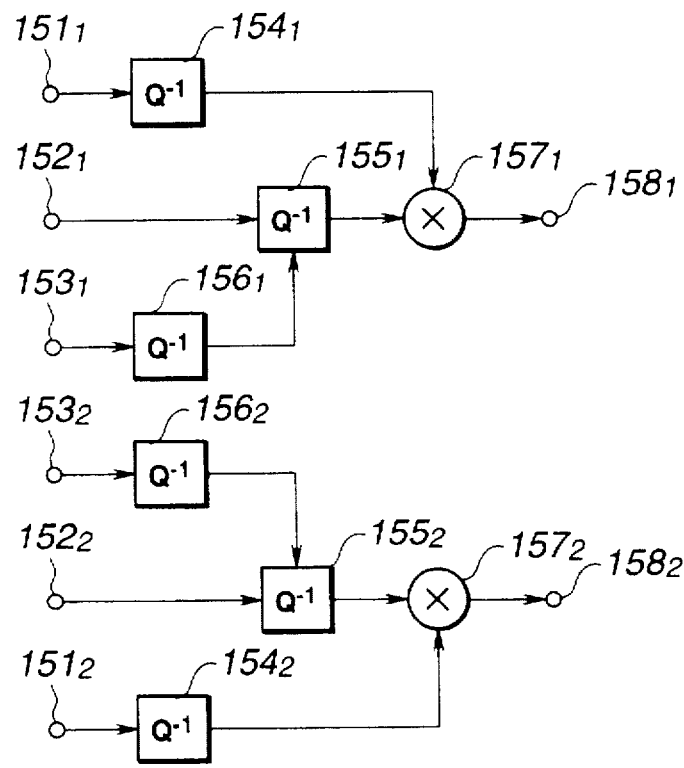
FIG.7 is a block circuit diagram showing an illustrative configuration of a first decoding circuit in the tonal component encoding circuit of the decoding apparatus of the embodiment.

FIG.7 shows an illustrative configuration of the first decoding unit 134 for decoding the channel-based tonal components encoded without being in common, shown in FIG.4. The configuration of FIG.7 is a counterpart of that of the first encoding circuit 124 shown in FIG.3.

In FIG.7, terminals $151_1$, $152_1$, $153_1$ are associated with the channel $ch_1$, while terminals $151_2$, $152_2$, $153_2$ are associated with the channel $ch_2$, respectively. The quantized scale factors from the terminals $147_1$ or $147_2$ of FIG.5 are fed to the terminals $151_1$, $151_2$, respectively, while the normalized and quantized frequency components from the terminals $148_1$ or $148_2$ of FIG.5 are fed to the terminals $152_1$, $152_2$, and the quantized quantization step information from the terminals $149_1$ or $149_2$ of FIG.5 are fed to the terminals $153_1$, $153_2$, respectively. The signals fed to the terminals $151_1$, $151_2$ to $153_1$, $153_2$ are fed to associated dequantizers $154_1$, $154_2$ to $156_1$, $156_2$ for dequantization.

The dequantized frequency components from the dequantizers $155_1$, $155_2$ are routed to multipliers $157_1$, $157_2$, respectively. These multipliers $157_1$, $157_2$ are also fed with scale factors from dequantizers $154_1$, $154_2$ configured to dequantize the quantized scale factors.

The multipliers $157_1$, $157_2$ multiply the frequency components and the scale factors to each other to cancel the normalization.

The denormalized channel-based tonal components are routed via associated terminals $158_1$, $158_2$ to the changeover switch 136 of FIG.4.

Figure 8:
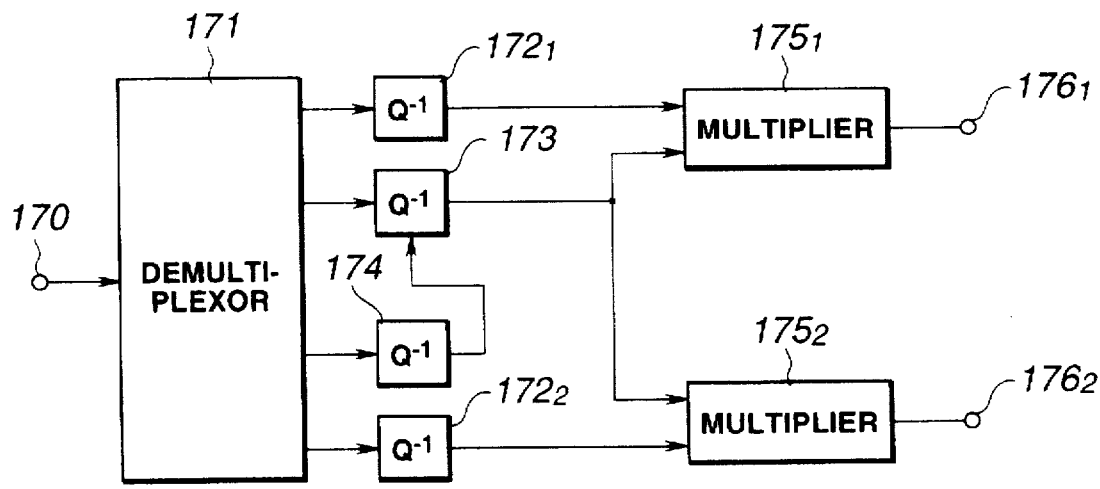
FIG.8 is a block circuit diagram showing an illustrative configuration of a second decoding circuit in the tonal component encoding circuit of the decoding apparatus of the embodiment.

The illustrative configuration of the second decoding unit 135 adapted to decode the tonal components encoded in common, shown in FIG.4, is explained by referring to FIG.8. The configuration of FIG.8 is a counterpart of that of the second decoding circuit 125 shown in FIG.3.

In FIG.8, the encoded signals of the tonal components, handles and encoded in common, are fed to a terminal 170 corresponding to the terminal 169 of FIG.6. The signal supplied to the terminal 170 is demultiplexed by a demultiplexor 171 into quantized channel-based scale factors, quantized quantization step information and the frequency components quantized by being handled in common.

The quantized channel-based scale factors are fed to and dequantized by associated dequantizers $172_1$, $172_2$. The channel-based scale factors, dequantized by these dequantizers $172_1$, $172_2$, are routed to associated multipliers $175_1$, $175_2$, respectively.

The frequency components, quantized by being handled in common, are fed to a dequantizer 173, while the quantized quantization step information is routed to a dequantizer 174. The dequantizer 173 dequantizes the frequency components, quantized by being handled in common, based upon the quantization step information dequantized by the dequantizer 174. The frequency components, dequantized by the dequantizer 174 by being handled in common, are routed to the multipliers $175_1$, $175_2$.

Thus the multipliers $175_1$, $175_2$ multiply the frequency components by the scale factors associated with the channels $ch_1$, $ch_2$ to cancel the normalization.

The denormalized channel-based tonal components are fed va associated terminals $176_1$, $176_2$ to the changeover switch 136 of FIG.4.

Figure 9:
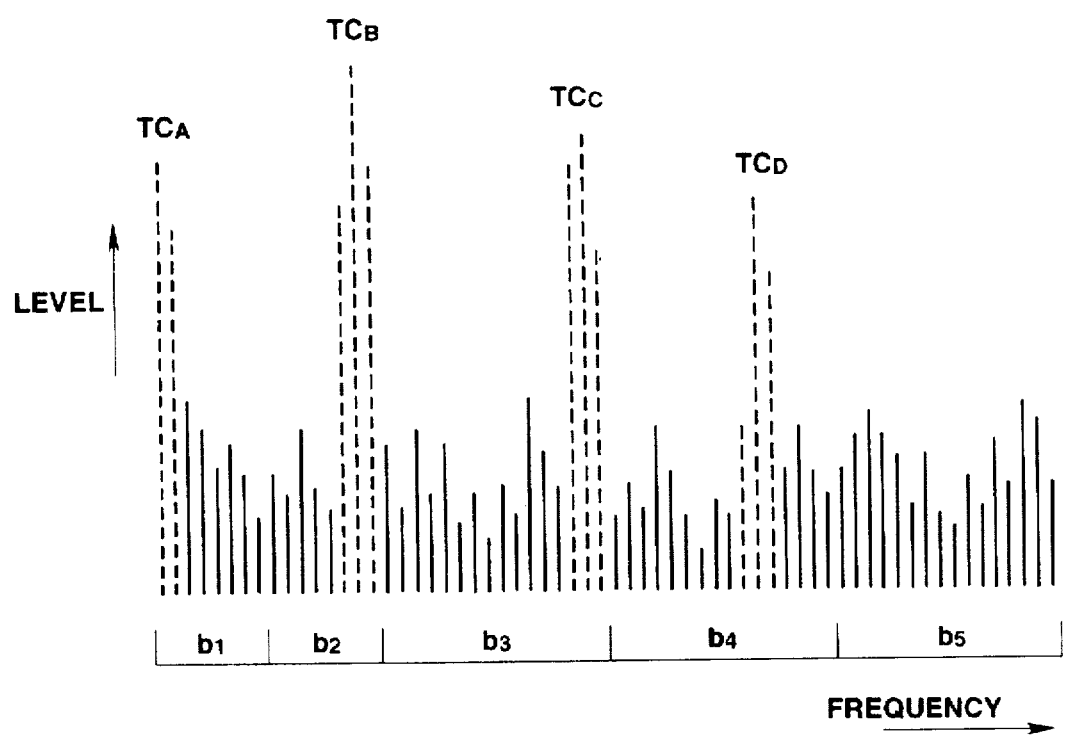
FIG.9 is a graph showing illustrative original spectral signals in the signal encoding of the embodiment.

The separation of the tonal components and the noise components by the signal component separating circuits $102_1$, $102_2$ of FIG.1 is now explained by referring to FIGS.9.

Figure 10:
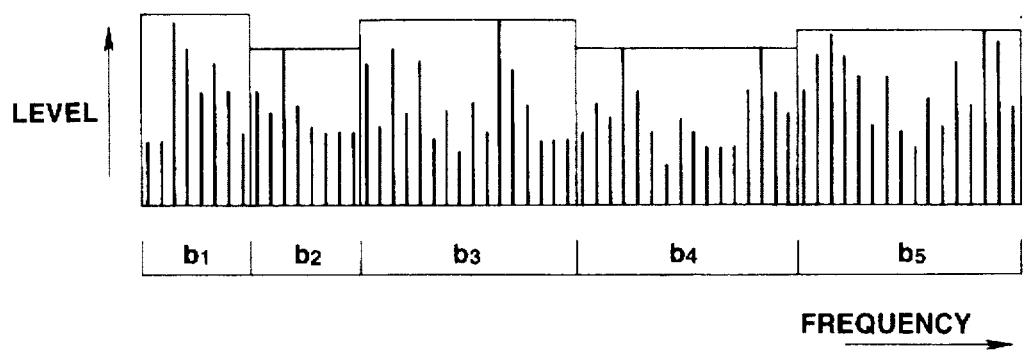
FIG.10 is a graph showing illustrative noise components obtained on subtracting tonal components from the original spectral signals in the signal encoding of the embodiment.

FIG.9 shows typical spectral signals (frequency components) supplied from the converting circuits $101_1$, $101_2$. FIG.10 shows noise components corresponding to the spectral signals of FIG.9 from which four tonal components $TC_A$, $TC_B$, $TC_C$ and $TC_D$, shown shaded in FIG.9, have been omitted. In FIG.9, the ordinate shows the levels (dB) of absolute values of the spectral signals (frequency components) obtained by MDCT, and the input audio signal is transformed into e.g., 64 spectral signals from frame to frame.

Since the tonal components are usually concentrated in a smaller number of spectral signals, the number of quantization bits is not increased excessively if these tonal components are quantized with fine steps. The encoding efficiency can be improved by normalizing and subsequently quantizing these tonal components. However, since the spectral signals constituting the tonal components are relatively few, the normalization or re-quantization steps, for example, may be omitted for simplifying the apparatus.

Referring to FIG.10, not all tonal components shown shaded in FIG.9 are not omitted, but the portions of the tonal components lower than a pre-set level are left as noise components. The noise components of FIG.10 may be obtained by subtracting the encoded and subsequently decoded tonal components from the original spectral signals. The method of extracting the tonal components encompasses not only the method of subtracting a signal equivalent to the encoded and subsequently decoded tonal components from the original spectral signals, but also the method of setting the spectral signals of the extracted tonal components to zero. The "signal freed of tonal components" as used in the present specification are meant to comprise these two possibilities. Since the tonal components $TC_A$, $TC_B$, $TC_C$ and $TC_D$ are omitted from the original spectral signals for the bands b1 to b5, the normalization coefficients in the respective encoding units are of smaller values, so that it is possible to reduce the quantization noise even with the use of a small number of bits.

In addition, if the properties of the hearing sense of the human being are taken into account, the noise components can be encoded more efficiently. That is, the masking effect operates effectively in the vicinity of the tonal components on the frequency axis. Thus, even if encoding is carried out on the assumption that the noise components in the vicinity of the omitted tonal components are equal to zero, there is not much difference of the subsequently decoded acoustic signals from the original sound insofar as the hearing sense of the human being is concerned.

Figure 11:
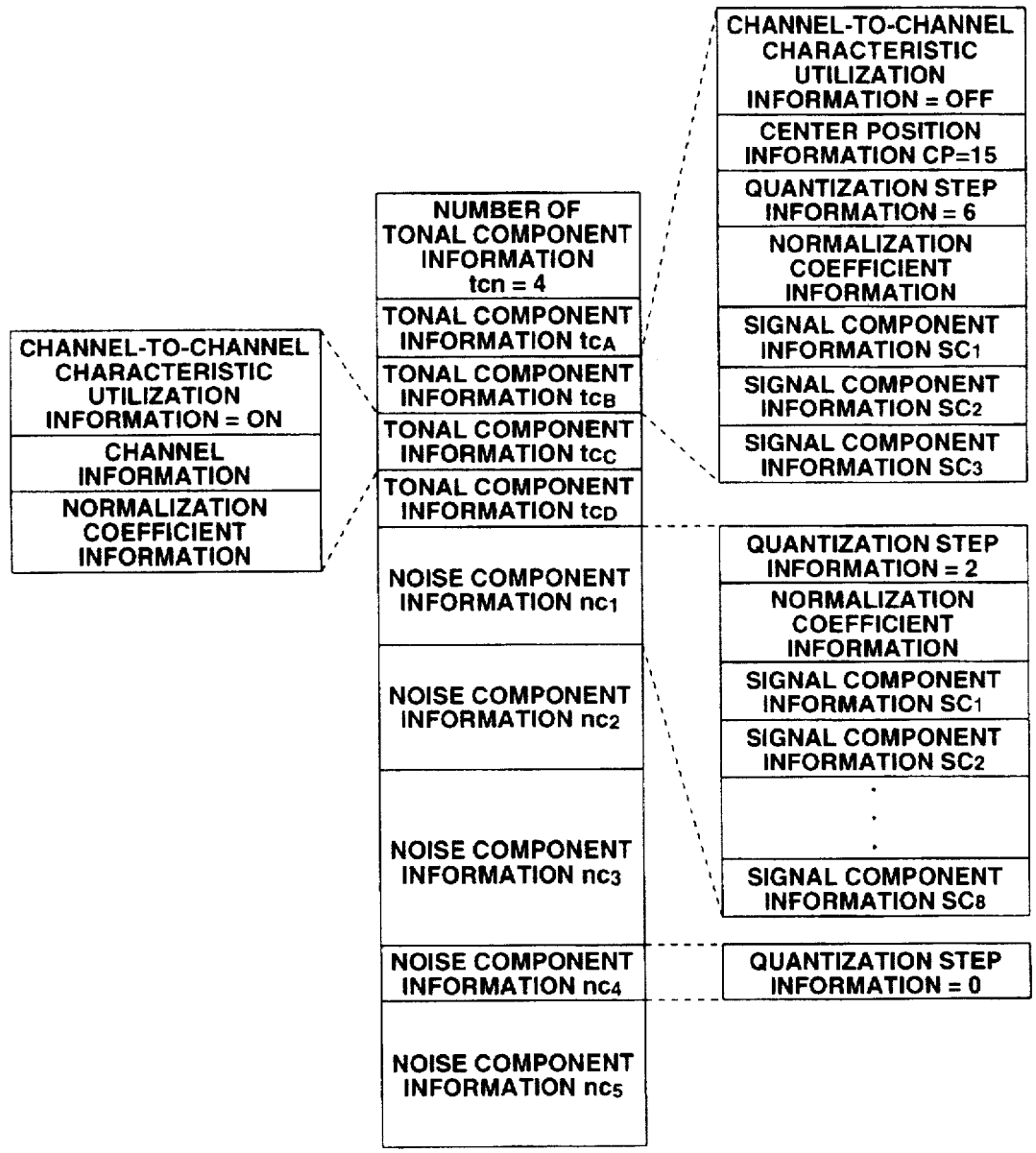
FIG.11 illustrates an example of a code string obtained on signal encoding of the embodiment.
Figure 12:
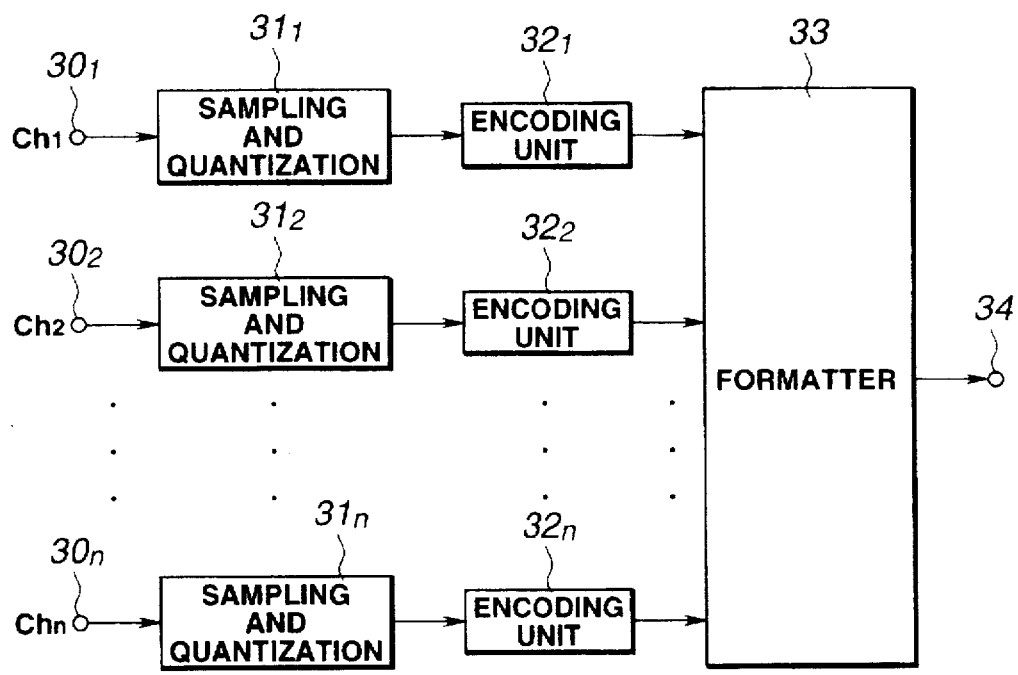
FIG.12 is a schematic block circuit diagram showing an encoding apparatus for channel-based encoding.
Figure 13:
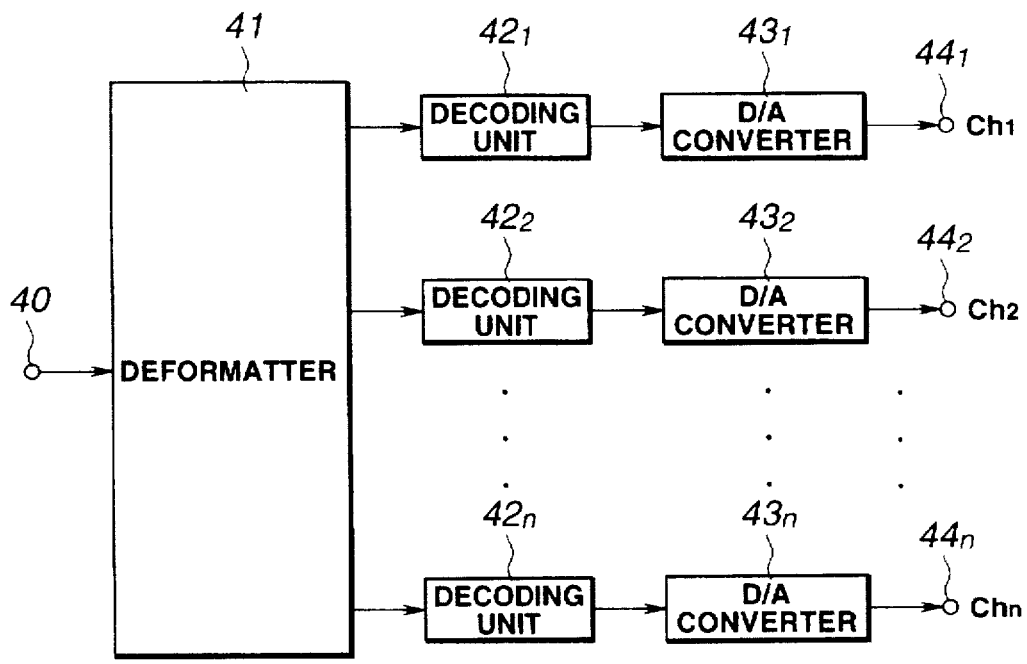
FIG.13 is a schematic block circuit diagram showing a decoding apparatus for decoding signals encoded by channel-based encoding.

FIG.11 shows an illustrative code string (the code string recorded on a recording medium) in case the spectral signal of FIG.9 is encoded after separation thereof into tonal components and noise components.

Referring to FIG.11, the number of tonal component information data tcn, which is four in the example of FIG.11, followed by tonal component information data $tc_A$, $tc_B$, $tc_C$ and $tc_D$, associated with the tonal components $TC_A$, $TC_B$, $TC_C$ and $TC_D$ of FIG.9, and by noise component information data $nc_1$, $nc_2$, $nc_3$, $nc_4$ and $nc_5$, for the bands b1 to b5 of FIG.10, are arrayed in this sequence as the code string.

For the tonal component information data, first a channel-to-channel characteristics utilization information, specifying whether or not the plural-channel tonal components have been handled in common, is arrayed. If the channel-to-channel characteristics utilization information is off, that is if the tonal components are not handled in common, the channel-to-channel characteristics utilization information is followed by a center position information data specifying the center component of the tonal components, which is 15 in the case of the tonal component $TC_B$, the quantization step information data specifying the number of quantization bits, which is e.g., 6 for the tonal component $TC_B$, and by the normalization coefficient information data. These information data are arrayed in the code string along with the normalized and quantized signal component information data, such as information data $SC_1$, $SC_2$ and $SC_3$. If the quantization step is fixed depending upon the frequency, there is naturally no necessity of arraying the quantization step information.

Although the position of the center component of the tonal components is used in the above embodiment as the position information for the tonal components, it is possible to record the number of the lower most spectral component, which is 14 in the case of the tonal component $TC_B$.

Conversely, if the tonal components are handled in common, the channel-to-channel characteristics utilization information, which is now ON, followed by the information concerning the channel by which the frequency component information data handled in common is transmitted, and by the normalization coefficient information (scale factors), is arrayed in e.g., the tonal component information data $tc_c$ of FIG.11.

The noise component information, such as the noise component information $nc_1$, contains the quantization step information, normalization coefficient information data (scale factors) and the normalized and quantized signal component information, such as the information data, $SC_1$, $SC_2$, ..., $SC_8$.

In FIG. 11, the quantization step information being zero, such as the noise component information $nc_4$ of FIG.11 associated with the band b4 of FIGS.9 and 10, indicates that encoding is actually not carried out for the encoding unit. As for these noise component information data, there is no necessity of recording the quantization step information if the quantization step is pre-set depending upon the frequency. However, in such case, it becomes impossible to designate the encoding unit in which the encoding actually is not carried out, such as the band b4. In such case, it suffices to add a one-bit flag for specifying whether or not encoding is actually carried out in each encoding unit.

The present Assignee has proposed a technique of separately encoding tonal and noise components in International Application No.PCT/JP94/01056 (International Publication No. WO95/01680, date of International Publication Jan. 12, 1995; European Patent Application Publication No. 0645769 A2 (date of publication of application Mar. 29, 1995, Bulletin 95/13), International Application No. PCT/JP94/01863, International Application No. PCT/JP95/0635, in addition to the above-referenced PCT/JP94/00880. The techniques disclosed therein may be applied to the present embodiment.

With the above-described embodiment, the compression efficiency may be improved by handling tonal components of plural channels in common, thereby lowering the transmission rate and realizing optimum coding and high encoding efficiency.

What is claimed is:

1. A signal encoding method, comprising the steps of:
   converting plural-channel input signals into frequency components;
   separating the frequency components into first signals made up of tonal components and second signals made up of other components;
   encoding the first signals of at least two of the plural channels, the encoding being one of encoding in common the first signals of each of at least two of the plural channels and separately encoding the first signals of each of the at least two of the plural channels.

2. The signal encoding method as claimed in claim 1, further comprising the steps of:
   detecting characteristics of the first signals of the at least two of the plural channels; and
   based upon the detected characteristics, selecting between separately encoding the first signals of each of the at least two of the plural channels and encoding in common the first signals of each of the at least two of the plural channels 3. The signal encoding method as claimed in claim 2, wherein said step of selecting between said separately encoding and said encoding in common is carried out from one tonal component to another.

4. The signal encoding method as claimed in claim 1, wherein said first signals of the at least two of the plural channels are encoded in common only if the tonal components exist at corresponding positions of the at least two of the plural channels.

5. The signal encoding method as claimed in claim 1, further comprising the step of:
   encoding the second signals.

6. A signal encoding apparatus, comprising:
   means for converting input signals of plural channels into frequency components;
   signal component separating means for separating the frequency components of the plural channels into first signals made up of tonal components and second signals made up of other components;
   encoding means for encoding the first signals of at least two of the plural channels, the encoding being one of encoding in common the first signals of each of the at least two of the plural channels and separately encoding the first signals of each of the at least two of the plural channels.

7. The signal encoding apparatus as claimed in claim 6, wherein said encoding means comprises:
   detection means for detecting characteristics of the first signals of the at least two of the plural channels;
   first encoding means for separately encoding said first signals of the at least two of the plural channels;
   second encoding means for encoding in common the first signals of the at least two of the plural channels; and
   selection means for selecting one of the first encoding means and the second encoding means based upon an output of said detection means.

8. The signal encoding apparatus of claim 6, wherein the encoding means is a first encoding means, further comprising:
   second encoding means for encoding the second signals.

9. A signal decoding method for decoding an encoded signal, comprising the steps of:
   decoding said first and second signals, wherein the improvement resides in]
   decoding encoded first signals of plural channels based upon results of a detection of characteristics of said first signals of at least two of the plural channels; and
   decoding channel-based encoded second signals from one channel to another, the encoded first signals and encoded second signals generated by separating frequency components of plural channels into first signals made up of tonal components and into second signals made up of other components.

10. The signal decoding method as claimed in claim 9, wherein the step of decoding the encoded first signals comprises the step of:
    selecting between separately decoding the encoded first signals and decoding in common the encoded first signals based upon the results of the detection of said characteristics of said first signals, wherein the encoding of the encoded first signals being one of encoding in common the first signals of each of the at least two of the plural channels and separately encoding the first signals of each of the at least two of the plural channels.

11. The signal decoding method as claimed in claim 9, further comprising the step of:
    decoding the second signals.

12. A signal decoding apparatus, comprising:
    means for decoding encoded first signals of at least two of plural channels based upon results of a detection of characteristics of said first signals; and means for decoding channel-based encoded second signals from one channel to another, the encoded first signals and encoded second signals generated by separating frequency components of plural channels into first signals made up of tonal components and into second signals made up of other components.

13. The signal decoding apparatus as claimed in claim 12, wherein the means for decoding the encoded first signals comprises:

first decoding means for decoding separately encoded first signals;

second decoding means for decoding first signals encoded in common; and selection means for selecting one of said first decoding means and said second decoding means based upon the results of the detection of said characteristics of said first signals.

14. The signal decoding apparatus of claim 9, wherein the encoding means is a first encoding means, further comprising:

second decoding means for encoding the second signals.

* * * * *

UNITED STATES PATENT AND TRADEMARK OFFICE
CERTIFICATE OF CORRECTION

PATENT NO.: 5,758,316
DATED: May 26, 1998
INVENTOR(S): YOSHIAKI OIKAWA ET AL.

It is certified that error appears in the above-identified patent and that said Letters Patent is hereby corrected as shown below:

At Col. 14, lines 37 and 38, please delete "decoding said first and second signals, wherein the improvement resides in]"

Signed and Sealed this

Eleventh Day of August 1998

Attest:

BRUCE LEHMAN

Attesting Officer

Commissioner of Patents and Trademarks